United States Patent
Kwakernaak et al.

(10) Patent No.: US 7,773,840 B2
(45) Date of Patent: Aug. 10, 2010

(54) INTERFACE FOR A-SI WAVEGUIDES AND III/V WAVEGUIDES

(75) Inventors: Martin H. Kwakernaak, New Brunswick, NJ (US); Winston Kong Chan, Princeton, NJ (US); David Capewell, Browns Mills, NJ (US); Hooman Mohseni, Wilmette, IL (US)

(73) Assignee: Novatronix Corporation, Seoul (KR)

( * ) Notice: Subject to any disclaimer, the term of this patent is extended or adjusted under 35 U.S.C. 154(b) by 748 days.

(21) Appl. No.: 11/545,061

(22) Filed: Oct. 6, 2006

(65) Prior Publication Data

US 2007/0147762 A1 Jun. 28, 2007

Related U.S. Application Data

(60) Provisional application No. 60/724,517, filed on Oct. 7, 2005.

(51) Int. Cl.
G02B 6/26 (2006.01)
(52) U.S. Cl. .............................. 385/29; 438/31; 438/32; 257/E45.006
(58) Field of Classification Search ............. 438/31–32; 385/29; 257/E45.006
See application file for complete search history.

(56) References Cited

U.S. PATENT DOCUMENTS

| 6,380,006 | B2 | 4/2002 | Kido |
| 6,434,175 | B1 | 8/2002 | Zah |
| 6,614,977 | B2 | 9/2003 | Johnson |
| 2003/0016895 | A1 | 1/2003 | Holm et al. |
| 2004/0248380 | A1 | 12/2004 | Aulnette |
| 2004/0265745 | A1 | 12/2004 | Sho et al. |

*Primary Examiner*—Thao X Le
*Assistant Examiner*—Elias Ullah
(74) *Attorney, Agent, or Firm*—Drinker Biddle and Reath LLP

(57) ABSTRACT

A method of coupling a waveguide to a multi-layered active device structure on a substrate is described. The method includes forming a junction area by etching the active device structure to form a sloped etch profile with respect to the substrate, aligning multiple layers of the multi-layered active device structure via an etch stop adjacent the multi-layered active device structure, and depositing the waveguide over the etched active device structure, wherein a sloped active passive junction is formed at the junction area that reduces residual interface reflection in a resulting coupled device. Also described is a method for removing at least one laser layer in a sloped junction region forming passive amorphous silicon waveguides. This includes depositing a SiN layer for use as an etch mask, patterning a photoresist mask, patterning the SiN layer by reactive ion etching, stripping the photoresist mask, and etching the at least one laser layer.

6 Claims, 6 Drawing Sheets

INTERFACE FOR A-SI WAVEGUIDES AND III/V WAVEGUIDES

CROSS REFERENCE TO RELATED APPLICATIONS

This Application claims the benefit of priority to U.S. Provisional Patent Application Ser. No. 60/724,517, entitled "INTERFACE FOR a-SI WAVEGUIDES AND III/V WAVEGUIDES," filed Oct. 7, 2005, the entire disclosure of which is hereby incorporated by reference as if being set forth herein in its entirety.

STATEMENT REGARDING FEDERALLY SPONSORED RESEARCH

Field of the Invention

The present invention is directed generally methods of coupling waveguides, and, more particularly, to a method of integrating amorphous silicon waveguides with active III/V waveguides.

DESCRIPTION OF THE BACKGROUND

Optical waveguides are the cornerstone of integrated optical circuits. An optical waveguide or combination of optical waveguides is typically assembled to form devices such as couplers, splitters, ring resonators, arrayed waveguide gratings, mode transformers, and the like. These devices are further combined on an optical chip to create an integrated optical device or circuit for performing the desired optical functions, such as, for example, switching, splitting, combining, multiplexing, demultiplexing, filtering, and clock distribution. As used herein, the expression "integrated optical circuits" may include a combination of optically transparent elongated structures for guiding, manipulating, or transforming optical signals that are formed on a common substrate or chip of monolithic or hybrid construction.

Typically, formation of the waveguide begins with formation of the lower optical cladding on a suitable substrate, followed by formation of an optical core, typically by chemical vapor deposition, lithographic patterning, and etching, and finally, surrounding the core with an upper optical cladding layer. For example, a ridge waveguide is typically formed on a substrate by forming a lower optical cladding, then forming through chemical vapor deposition, lithographic patterning, and etching, an optical core element, and lastly by surrounding the optical core element with an upper optical cladding layer. Other types of optical waveguides used in the formation of integrated optical devices and circuits include slab, ridge loaded, trench defined, and filled trench waveguides.

Further, semiconductor devices often include multiple layers of conductive, insulating, and semiconductive layers. Often, the desirable properties of such layers improve with the crystallinity of the layer. Attempts have been made to fabricate high quality crystalline optical waveguide devices. However, such attempts typically have succeeded only on bulk oxide substrates. Attempts to grow such devices on a single crystal semiconductor or compound semiconductors substrates, such as germanium, silicon, and various insulators, have generally been unsuccessful because crystal lattice mismatches between the host crystal of the substrate and the grown crystal of the optical waveguide layer have caused the resulting crystal of the optical waveguide layer to be of low crystalline quality.

Silicon (Si) is the most widely used semiconductor material in modern electronic devices. Single crystalline Si of high quality is readily available, and the processing and microfabrication of Si are well known. The transparency of Si in the near-infrared makes Si an ideal optical material.

In part due to these ideal optical properties, Si-based waveguides are often employed as optical interconnects on Si integrated circuits, or to distribute optical clock signals on an Si-based microprocessor. In these and other instances, Si provides improved integration with existing electronics and circuits. However, at present pure Si optical waveguide technology is not well developed, in part because fabrication of waveguides in Si requires a core with a higher refractive index than that of crystalline Si (c-Si).

Historically, optical links were single wavelength and point-to-point, with all functionality in the electronics domain. The implementation of telecommunication functions in the optical domain, in conjunction with the aforementioned development of the understanding of silicon as an optical material, led to the development of the optical integrated circuit (OEIC). The OEIC fabrication process borrows heavily from the electronic integrated circuit field, and as such may employ planar deposition, photolithography, and dry etching to form optical waveguides analogous to electronic circuit conductors.

Attempts to integrate voltage-controlled switching and attenuation functions into a silica glass platform exposed drawbacks stemming from the incorporation of classical IC technology for OEIC, including difficulty in processing optical materials with standard microelectronics fabrication equipment, a lack of repeatability, and high power consumption that caused chip-heating problems. Fortunately, silicon optical waveguiding technology provides for the production of low-cost, reliable, repeatable, low power silicon OEICs.

A difficult challenge facing high-index contrast optical systems is efficiently coupling light into and out of the OEIC. Particularly challenging is the coupling of light from a standard optical fiber or external light source to a silicon waveguide. A single-mode fiber core (n=1.5) typically has a diameter of 8 μm with a symmetric mode, but a silicon waveguide (n=3.45) is typically only a few micrometers in width with an asymmetric mode. To overcome these large differences in effective index, core size, and symmetry, a frequently used coupling is a waveguide taper.

Tapers reduce coupling loss through an adiabatic modal transformation, and may be used to increase the alignment tolerance of other optical devices, such as III-V lasers. Taper methods include pseudo-vertical tapering, and gradual horizontal and vertical modal tapering. Pseudo-vertical tapering, for example, from a 12 μm by 12 μm input to 4-5 μm waveguide has demonstrated losses as low as 0.5 dB/facet.

Therefore, a need exists for a silicon based semiconductor structure that provides a high quality optical waveguide interface and for a process for making such a structure for the formation of quality optical waveguide devices.

BRIEF SUMMARY OF THE INVENTION NEEDS TO COMPORT WITH CLAIMS

A method of coupling a waveguide to a multi-layered active device structure on a substrate is described. The method includes forming a junction area by etching the active device structure to form a sloped etch profile with respect to the substrate, aligning multiple layers of the multi-layered active device structure via an etch stop adjacent the multi-layered active device structure, and depositing the waveguide over the etched active device structure, wherein a sloped active passive junction is formed at the junction area that reduces residual interface reflection in a resulting coupled device.

Also described is a method for removing at least one laser layer in a sloped junction region forming passive amorphous silicon waveguides. The method includes depositing a SiN layer for use as an etch mask, patterning a photoresist mask, patterning the SiN layer by reactive ion etching, stripping the photoresist mask, and etching the at least one laser layer.

Further described is a method for etching laser layers of a wafer when forming a sloped junction region to passive amorphous silicon waveguides. The method includes etching an InGaAs cap portion with $H_2SO_4$:$H_2O_2$:$H_2O$, etching a first InP layer with HCl:$H_3PO_4$, rinsing the wafer with $NH_4OH$:$H_2O$, reactive ion etching an InGaAsP layer with a gas mixture, wherein the reactive ion etching forms a plasma polymer deposited on the wafer, removing the plasma polymer in an $O_2$ plasma, etching a second InP layer with HCl:$H_3PO_4$, rinsing the wafer with $NH_4OH$:$H_2O$ after etching the second InP portion, reactive ion etching a second InGaAsP layer and a third InP layer with the gas mixture, wherein the reactive ion etching forms a second plasma polymer deposited on the wafer, removing the second plasma polymer in an $O_2$ plasma, and etching a final InP layer with HCl:$H_3PO_4$.

Thus, the present invention provides a high quality optical waveguide interface and for a process for making such a structure for the formation of quality optical waveguide devices.

BRIEF DESCRIPTION OF THE SEVERAL VIEWS OF THE DRAWINGS

For the present invention to be clearly understood and readily practiced, the present invention will be described in conjunction with the following figures, wherein like reference numerals represent like elements, and wherein:

FIG. 6b is a corresponding drawing showing the significant layers of the device of FIG. 6a.

DETAILED DESCRIPTION OF THE INVENTION

Figure 1:
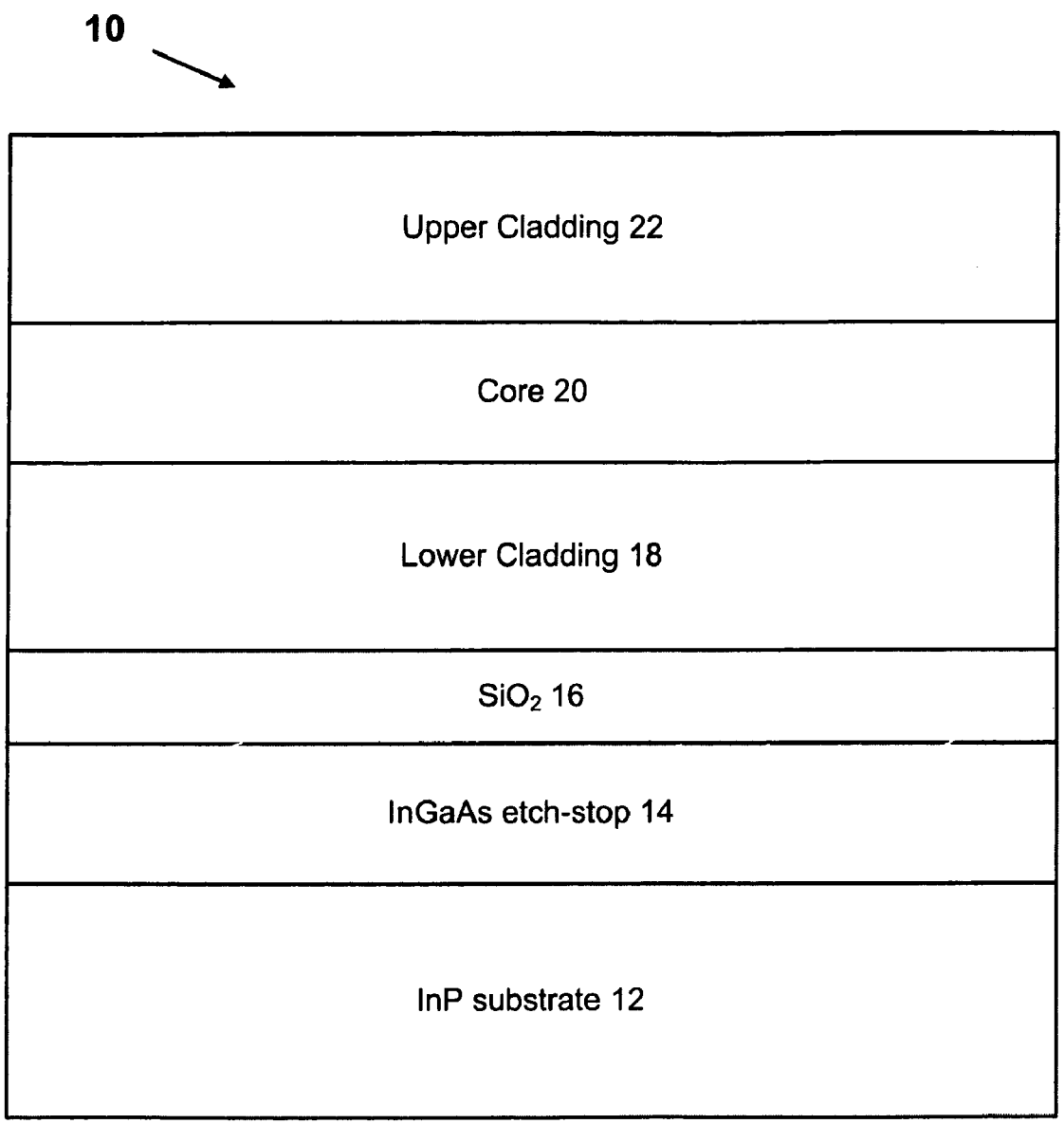
FIG. 1 is a block diagram of a layered optical waveguide.

It is to be understood that the figures and descriptions of the present invention have been simplified to illustrate elements that are relevant for a clear understanding of the present invention, while eliminating, for purposes of clarity, many other elements found in typical waveguide coupling techniques. Those of ordinary skill in the art will recognize that other elements are desirable and/or required in order to implement the present invention. However, because such elements are well known in the art, and because they do not facilitate a better understanding of the present invention, a discussion of such elements is not provided herein.

Amorphous silicon (a-Si) may present advantageous properties as silicon based waveguide core material. a-Si is understood to be a non-crystalline allotropic form of silicon. Silicon is normally tetrahedrally bonded to four neighboring silicon atoms, which is also the case in amorphous silicon. However, unlike crystalline silicon ("c-Si"), a-Si does not form a continuous crystalline lattice. As such, some atoms in an a-Si structure may have "dangling bonds," which occur when one of the tetrahedral bonds of the a-Si does not bond to one of the four neighboring atoms. Thus, a-Si may be considered "under-coordinated." The under-coordination of a-Si may be passivated by introducing hydrogen into the silicon. The introduction of hydrogen for passivation forms hydrogenated a-Si, which may provide a high electrical quality and relatively low optical absorption.

The density of pure silicon is lower than that of c-Si, and the refractive index of pure a-Si at near-infrared wavelengths may be higher than that of c-Si. Thus, in one exemplary embodiment of the present invention, a-Si may be serviceable as a waveguide core material on c-Si. However, as pure a-Si may contain a large density of point defects and dangling bonds, the optical absorption by an a-Si core at near-infrared wavelengths may be significant without the aforementioned hydrogen passivation. In other exemplary embodiments of the present invention, the upper cladding, core, and lower cladding may take the form of an a-Si based material, such as a-SiNxHy ($0<x<1.3, 0<y<0.3$), a-SiCxHy ($0<x<1, 0<y<0.3$), or a-SiOxHy ($0<x<1, 0<y<0.3$).

The refractive index of such an a-Si waveguide may be determined by selecting desirable core element and cladding refractive indices. If a higher refractive index contrast and appropriate waveguide geometry is chosen, very small bend radii may be possible for optical waveguides within integrated optical circuits without incurring significant propagation losses.

Hydrogenated a-Si films, such as those used in the aforementioned waveguides, may be deposited using a number of different techniques, including, for example, plasma enhanced chemical vapor deposition (PECVD), RF sputtering, and hot-filament CVD. Further, hydrogen content, void density, structural properties and optical and electronic properties of hydrogenated a-Si films may be critically dependent on the precise nature of the processing conditions by which the a-Si film is created. However, while hydrogenated a-Si may provide better transparency in the near-infrared than pure a-Si, pure a-Si may be processed more easily. Pure a-Si may also have a larger thermal stability then that of hydrogenated a-Si.

Further, such a-Si films may be formed using PECVD to have properties different from those of pure a-Si. For example, a $N_2$-based PECVD formation of a-Si may form an amorphous silicon nitride (a-SiN$_y$). Silicon nitrides may generally be used for a myriad of purposes in a variety of compound semi-conductor devices, such uses including, for example, surface passivation, interlayer elements and capacitor dielectrics.

As with any optics design, optical loss mechanisms, such as optical absorption and optical scattering losses, are of concern in the above-referenced waveguide embodiments. Scattering loss is common to all optical waveguide designs and is generally caused by roughness at the interfaces between core and clad, as well as by any inhomogeneities in the deposited film. Absorptive loss may be primarily dominated by optical absorption that excites stretching vibrational modes of atomic bonds between hydrogen or deuterium and heavier elements present in the deposited film. Such an absorptive loss may depend heavily on the amount of hydrogen or deuterium in the film, and/or on the particular optical wavelength or wavelengths propagating in the waveguide.

Absorptive loss may particularly be an issue for optical wavelengths near the primary or lower order overtones of a hydrogen—or deuterium—related vibrational stretching mode. The strength of a stretching vibrational mode absorption feature may decrease significantly for higher overtones. As a result, most of the visible and near infrared spectrum in such instances may exhibit low optical absorptive loss. For optical wavelengths near absorption, the absorption strength may be minimized by, for example, reducing the amount of hydrogen in the film by selecting lower hydrogen content precursors, optimizing the deposition process, or by post-deposition annealing. By replacing hydrogen with deuterium, the energy of the set of related primary and overtone stretching vibrational modes may decrease.

While the process modifications immediately hereinabove allow for desirable loss levels for a-Si waveguides deposited on thermally oxidized silicon wafers, the depositing of a-Si layers on InP substrates may result in the above-referenced and additional issues. For example, a-Si waveguide losses may be substantially higher on InP substrates, and blistering of the a-Si film when the wafer is heated to above 300° C. may occur.

An exemplary a-Si waveguide may be used for coupling in coupling processes, and is illustrated in FIG. 1. a-Si waveguide 10 may include a stack of quaternary layers upon a conventional InP substrate 12. The stack may form the active layer of the device and may include an etch-stop layer 14, such as an InGaAs layer, or alternatively, alternating InGaAs and InGaAsP layers. The stack may further include a $SiO_2$ barrier layer 16 atop etch-stop layer 14. Finally, atop $SiO_2$ barrier layer 16 may be a lower cladding layer 18, an active layer or core layer 20, and an upper cladding layer 22. In certain embodiments of the present invention, some of the layers, such as lower cladding layer 18, may be absent, provided the resulting waveguide provides the desired functionality.

The various layers of waveguide 10 may have certain thicknesses in order to produce desired refractive indices. For example, the desired refractive index for upper cladding 22, core 20, and lower cladding 18 may be achieved by adjusting the composition of the a-Si based material forming the same. In an exemplary embodiment, upper and lower cladding layers 22 and 18 may have an index of refraction about 3.17, while core layer 20 may have an index of refraction between about 3.27 and 3.32. The upper and lower claddings may be of any suitable thickness, such as within ranges of about 0.25-0.3 μm for upper cladding 22, and about 1-1.5 μm for lower cladding 18, for example. Similarly, core layer 20 may be of any suitable thickness, such as within the range of about 0.3-1 μm. In a preferred embodiment, upper cladding layer 22 may be about 0.25 μm thick, core layer 20 about 0.8 μm thick, and lower cladding layer 18 about 1.5 μm thick. Substrate 12, such as an In—P substrate, may be about 0.35 mm thick, and may have an index of refraction of about 3.17, for example. As substrate 12 may be composed of a variety of materials other than InP, the thickness of substrate 12 will be dependent on the composition of such substrate material. Additionally, with regard to the stack of FIG. 1 $SiO_2$ barrier layer 16 may have a thickness in the range between 0.5 and 10 and 100 nm, and etch-stop layer 14 may have a thickness of approximately 0.4 μm.

Referring still to FIG. 1, $SiO_2$ layer 16 may be introduced between the a-Si film and the semiconductor substrate. The purpose of this $SiO_2$ layer may be to suppress diffusion and other unwanted processes between materials. Since $SiO_2$ layer 16 may act as an optical barrier, a rather thick lower cladding 18 may be needed to avoid distortions of the mode. Fabricating the integrated device with a thicker lower cladding may be facilitated if the etch-stop is used. In an exemplary embodiment, InGaAS etch-stop layer 14 is used, and may act as an absorber for unguided light.

According to an aspect of the present invention, a method of integrating a-Si waveguides with active III/V waveguides in a novel design and fabrication of an interface is provided. While the introduction of $SiO_2$ layer 16, as discussed hereinabove, in an a-Si waveguide may solve issues with enhanced loss and blistering on InP substrates, the junction in the resulting integrated device may necessitate modification from those techniques commonly used for waveguide coupling. For example, because the refractive index of $SiO_2$ is much lower than that of the amorphous silicon and III/V materials, the $SiO_2$ may need to be removed from the optical path to avoid reflections and extra loss.

Figure 2:
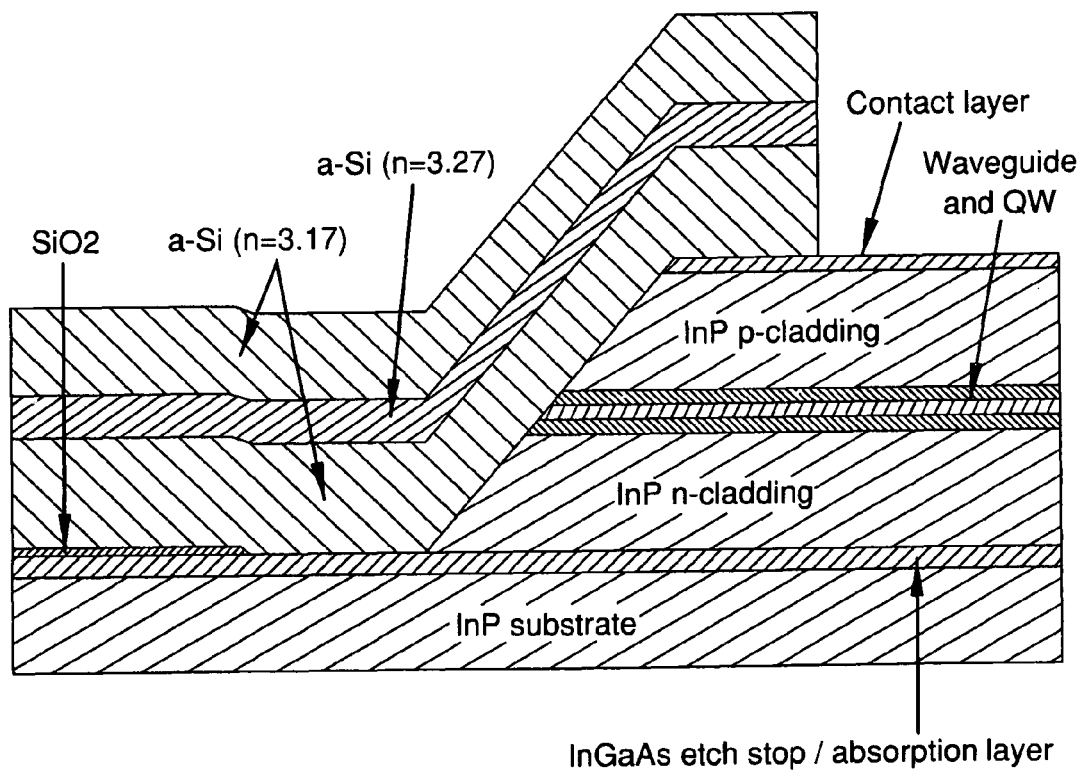
FIG. 2 is a schematic of layer structures at the junction area of waveguides.

More particularly, according to an aspect of the present invention, interfaces between active and passive components may have sloped regions. Referring now to FIG. 2, there is shown a sloped active/passive junction or interface in accordance with the present invention.

In accordance with FIG. 2, a wet-based chemical etching method may be used to produce active-passive junctions with a high uniformity and reproducibility of slope angle and total etch depth. According to an aspect of the present invention, junction position and shape may be defined using conventional photolithographic techniques. In such a case, protective layers may take the form of a photoresist mask for use in further processing, for example. In general, and by way of non-limiting example only, several methods for forming a sloped coupling joint were presented in U.S. Patent Application Publication No. 2005/0117844, which is incorporated by reference herein.

According to the exemplary embodiment of FIG. 2, a combination of selective and non-selective etching may be used. The selective etching may be employed to remove grown layers and may terminate at the top of the active layer stack. Correspondingly, the active layers may be non-selectively removed to the n-clad InP layer. The combination of selective and non-selective etches may serve to produce an acceptable profile with smooth surfaces without undercutting the active layers.

A combination of wet and dry etches may also be used. By replacing a selective wet etch for the etch stop layer with a non-selective dry etch, one may substantially eliminate large plateaus in the joint profile. By so doing, one may eliminate significant undercut of the cap layer at the top of the device, which may thus limit causation of the formation of a plateau during subsequent selective wet etching of InP.

After the etching steps, an a-Si waveguide structure may be deposited over the joint region to form an active/passive coupling. Such deposition may be accomplished using any suitable conventional manner, such as sputtering or plasma enhanced chemical vapor deposition, for example.

Referring specifically to FIG. 2, a schematic of the junction area between amorphous silicon waveguides and active III/V waveguides is shown. In an exemplary embodiment of the present invention, the layer structure of the active III/V waveguide may begin with an absorption/etch-stop layer composed of InGaAs, with a thickness of approximately 0.3 μm, on top of an InP substrate. Next may be an n-cladding layer, composed of InP, with a thickness of approximately 1.5 μm. The next layers make up the waveguide and quantum wells, composed of several layers of InGaAsP, having a total thickness of approximately 0.4 μm. A spacer layer may then be used, and may be composed of InP, with a thickness of approximately 0.3 μm. Next there may be another etch-stop layer, composed of InGaAsP, with a thickness of approximately 0.03 μm. This etch-stop layer may be followed by a p-cladding, composed of InP and having a thickness of approximately 1.5 μm. Finally, the cap layer composed of InGaAs may have a thickness of approximately 0.05 Ξm. This exemplary III/V layering structure is further summarized in Table 1.

TABLE 1

Semiconductor layer structure

| Layer | Material | Thickness (μm) |
|---|---|---|
| Cap | InGaAs | 0.05 |
| P-clad | InP | 1.5 |
| Etch-stop | InGaAsP | 0.03 |
| Spacer | InP | 0.3 |
| Wave wide and QW | InGaAsP (several layers) | 0.4 (total) |
| N-clad | InP | 1.5 |
| Absorber/etch-stop | InGaAs | 0.3 |

The a-Si layers of the a-Si waveguide may include the lower cladding, which may be composed of a-Si and have a thickness of approximately 1.5 μm, a core layer of a-Si having a thickness of approximately 0.4 μm, and an upper cladding layer of a-Si having a thickness of approximately 1 μm. These exemplary layers of the amorphous silicon waveguide are summarized in Table 2.

TABLE 2 a-SI waveguide layers

| Layer | Material | Thickness (μm) |
|---|---|---|
| Upper cladding | a-Si (n = 3.17) | 1 |
| Core | a-Si (n = 3.27) | 0.4 |
| Lower cladding | a-Si (n = 3.17) | 1.5 |

Yet more specifically, an InGaAs etch stop absorption layer is depicted in FIG. 2, as is a thin $SiO_2$ layer introduced to prevent diffusion related loss in the ends of the a-SI waveguides just before the junction area.

Figure 3:
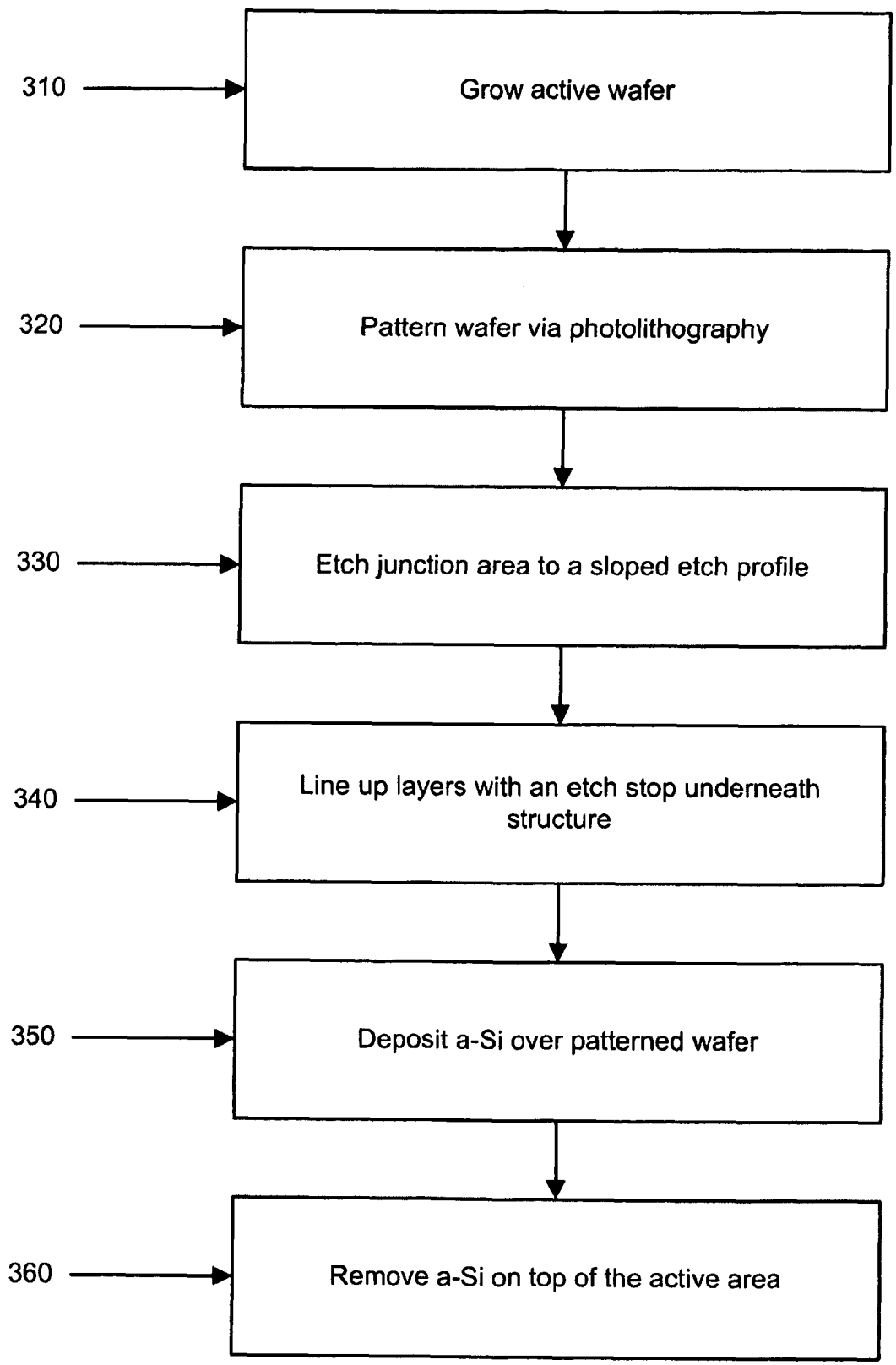
FIG. 3 is a flow chart outlining the steps in the formation of the active passive junction.

Referring now to FIG. 3, a flow chart outlining the steps in the formation of an active/passive junction is shown. At step 310, a wafer with InP/InGaAsP layers as described above and summarized in Table 1 may be generated. At step 320, the wafer may be patterned using photolithography. At step 330, the junction area may be etched in way such that a sloped etch-profile may appear, such as that illustrated in FIG. 2. At step 340, an etch stop underneath the structure may be used to make sure that the layers align up as designed. At step 350, a-Si may be deposited over the patterned wafer using a depositing technique, such as PECVD. At step 360, the a-Si on top of the active area may be removed.

The resulting structure may have a sloped interface between the active and passive waveguides. Sloped coupling joints may reduce residual interface reflection in a-Si waveguide-based photonic integrated circuits, which may improve device performance. Such a design is superior to a vertical junction, as a vertical junction may tend to produce more significant back reflections for a given effective index mismatch between the active and passive waveguides. This back reflection may result in significant interference and losses, which can deteriorate the performance of optical devices. This risk may be at least partially mitigated by suppressing reflections using the sloped active-passive junction, since the average change of index may be less in such a structure and the back reflection is not directed at the waveguide. As with many integrated optical devices, keeping reflections low may be of high importance.

Figure 4:
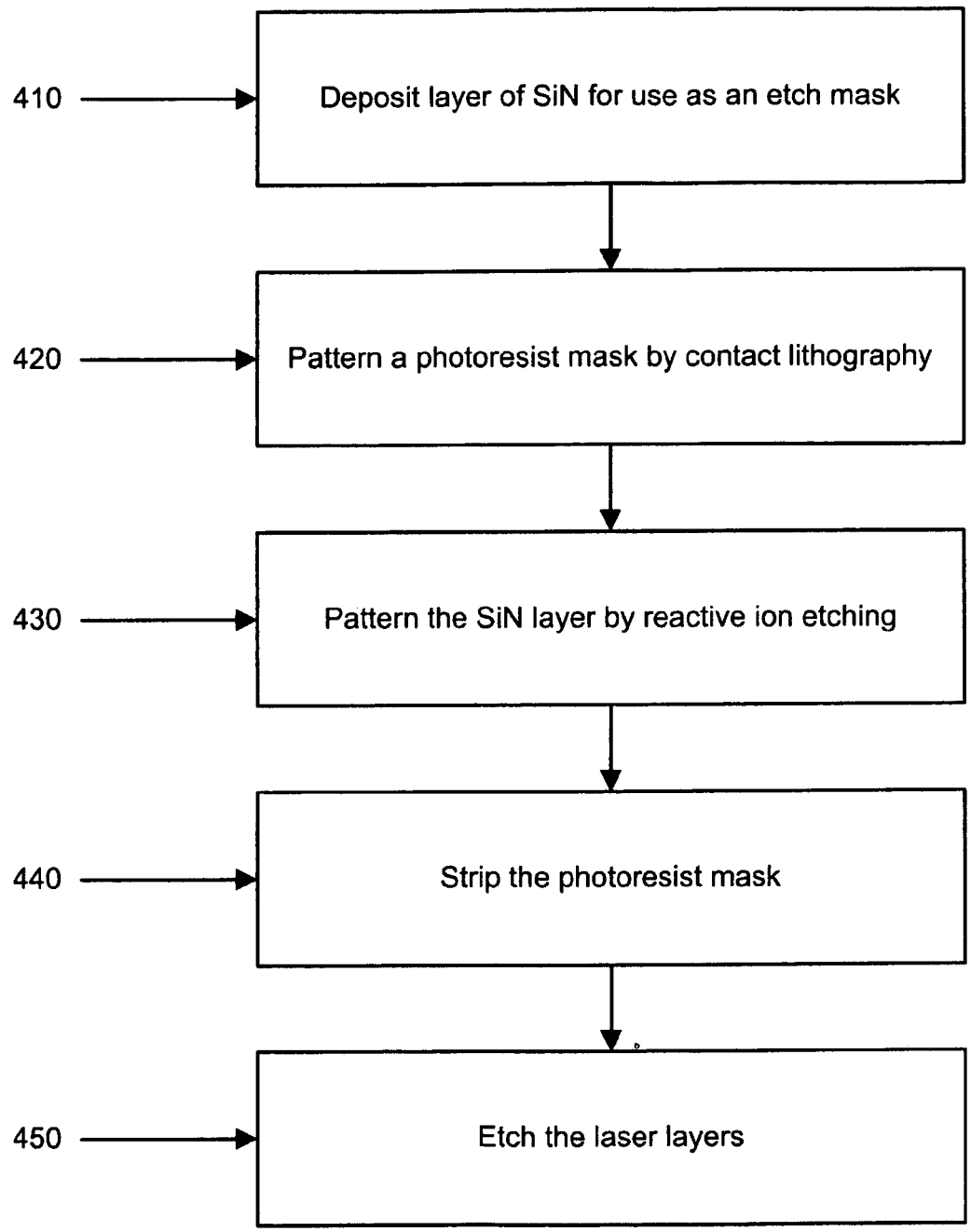
FIG. 4 is a flowchart illustrating the steps in an active passive etching procedure for removing the laser layers in regions where passive a-Si waveguides will be formed.

According to an aspect of the present invention, an active/passive etching procedure, such as that of FIG. 4, may be used for removing the laser layers in regions where the passive a-Si waveguides will be formed. This etching procedure may take advantage of the crystal orientation properties of etch solutions to obtain the resulting sloped junction.

FIG. 4 illustrates an active/passive etching procedure in accordance with the present invention. At step 410, an approximately 170 nm thick layer of SiN may be deposited by plasma enhanced chemical vapor deposition (PECVD), which may be used as an etch mask. At step 420, a photoresist mask may be patterned by contact lithography. It may be important to align this mask similarly from wafer to wafer so that the stepper may automatically find the alignment marks in subsequent photolithography steps. At step 430, the SiN layer may be patterned by reactive ion etching with a gas mixture, such as He, $CF_4$ and $O_2$, using the photoresist mask. At step 440, the photoresist mask may be stripped. At step 450, the laser layers may be etched.

Figure 5:
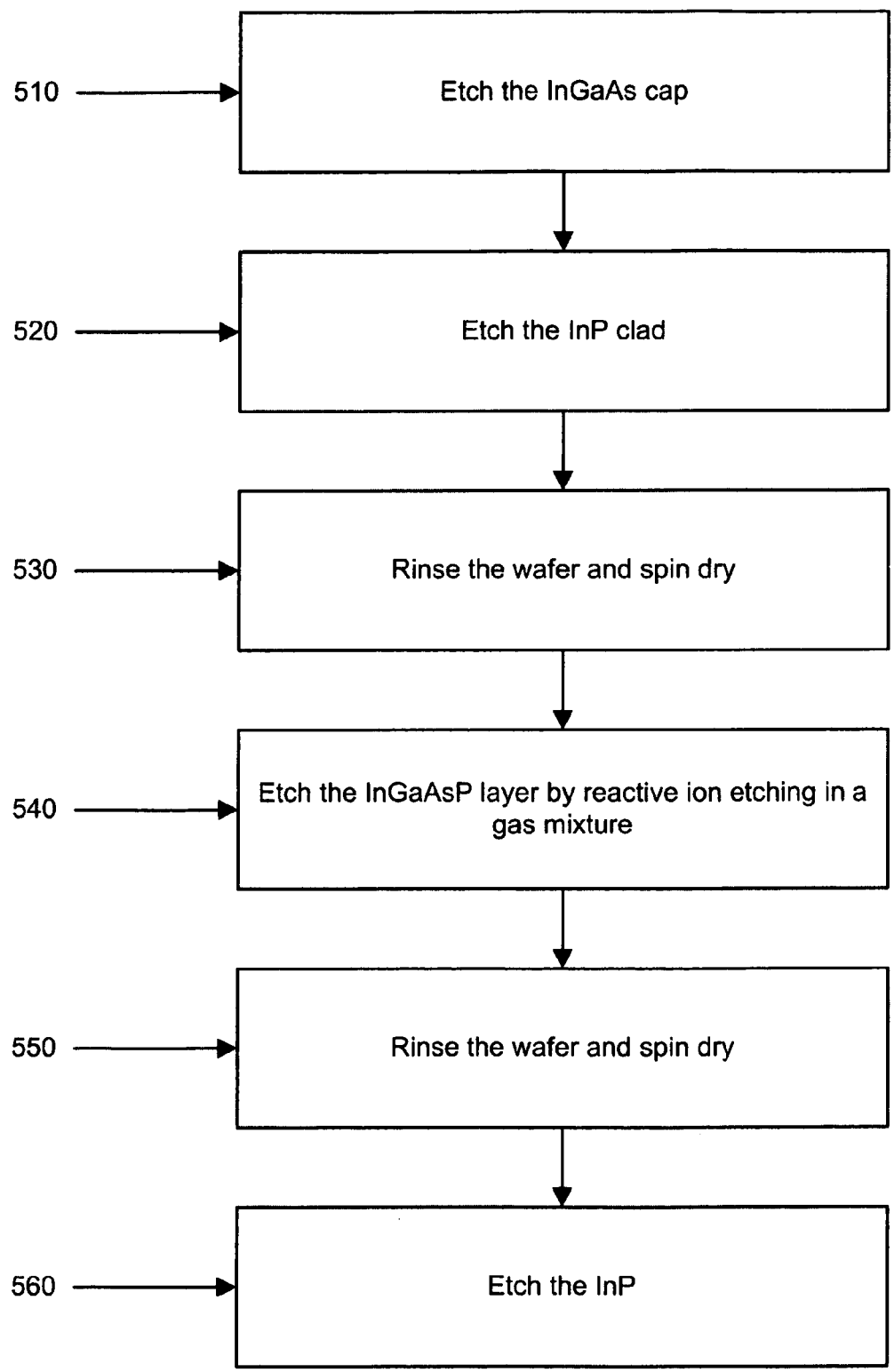
FIG. 5 is a flowchart illustrating the steps for etching laser layers.

FIG. 5 illustrates an etch of laser layers in accordance with the present invention. At step 510, the InGaAs cap may be etched with $H_2SO_4$:$H_2O_2$:$H_2O$ at a ratio of approximately 10:1:1 for approximately 30 seconds at 5° C. This etch may stop at the InP clad. At step 520, the InP clad may be etched in HCl:$H_3PO_4$ at a ratio of approximately 3:1 for approximately 2 minutes at 5° C. This etch may stop at the InGaAsP layer. At step 530, the wafer may be rinsed with $NH_4OH$:$H_2O$ at a ratio of approximately 1:20 for 20 seconds, and then spin dried. Further, the InGaAsP layer may be reactive ion etched in a gas mixture, such as 4.4 sccm Ar, 11 sccm $CH_4$ and 15 sccm $H_2$ at 20 mT with 250 W, for approximately 5 minutes. The etch depth may be determined by a stylus profilometer. While overetching into the InP layer may acceptable, underetching typically may not be acceptable. After reactive ion etching, the plasma deposited polymer may be removed in an $O_2$ plasma at 275 W for 15 minutes.

At step 540, the InP may be etched in a solution of HC1:$H_3PO_4$ at a ratio of approximately 3:1 for approximately 30 seconds at 5° C. The etch may typically stop at the InGaAsP layer. At step 550, the wafer may be rinsed with a solution of $NH_4OH$:$H_2O$ at a ratio of approximately 1:20 for 20 seconds and further spin dried. The InGaAsP and InP layers may be reactive ion etched in a gas mixture, such as 4.4 sccm Ar, 11 sccm $CH_4$ and 15 sccm $H_2$ at 20 mT with 250 W for approximately 30 minutes. Again, the etch depth may be determined by a stylus profilometer, with overetching into the InP layer being acceptable but not underetching. After the reactive ion etch, the plasma deposited polymer may be removed in an $O_2$ plasma at 275 W for 15 minutes.

Figure 6A:
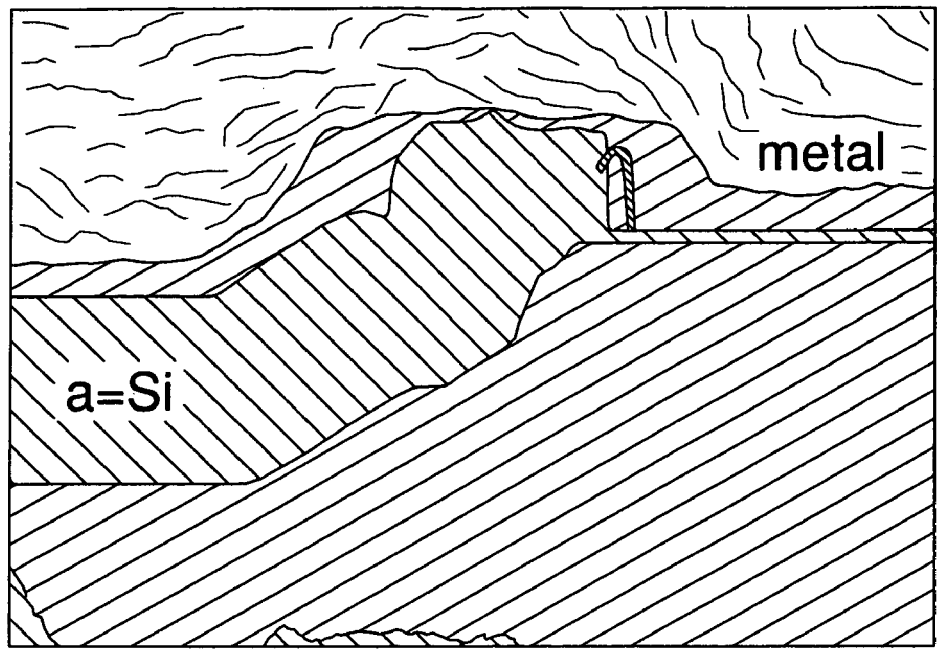
FIG. 6a is an SEM image of a focused ion beam sectioned junction of a completed device.
Figure 6B:
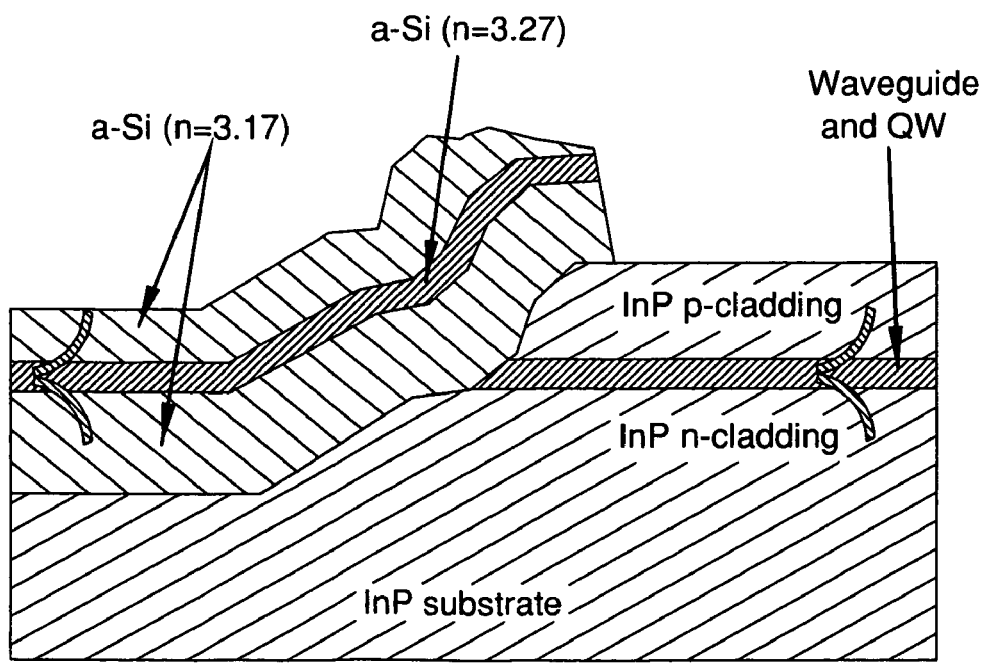

At step 560, the InP may be etched in a solution of HC1:$H_3PO_4$ at a ratio of approximately 3:1 for approximately 2 minutes at 5° C. The etch may typically stop at the InGaAsP layer. The resulting junction etched by the methods described above is shown in FIGS. 6a and 6b. An SEM image of a focused ion beam sectioned junction of a completed device is shown in FIG. 6a, and a corresponding drawing showing the significant layers of the device is illustrated in FIG. 6b. The layers as shown in FIGS. 6a and 6b may be the same as those relating to and describing FIG. 2 hereinabove.

Those of ordinary skill in the art will recognize that many modifications and variations of the present invention may be implemented. The foregoing description and the following claims are intended to cover all such modifications and variations falling within the scope of the following claims, and the equivalents thereof.

What is claimed is:

1. A method for etching laser layers of a wafer when forming a sloped junction region to passive amorphous silicon waveguides, comprising:
   etching an InGaAs cap portion with $H_2SO_4:H_2O_2:H_2O$;
   etching a first InP layer with $HCl:H_3PO_4$;
   rinsing said wafer with $NH_4OH:H_2O$;
   reactive ion etching an InGaAsP layer with a gas mixture, wherein said reactive ion etching forms a plasma polymer deposited on said wafer;
   removing said plasma polymer in an $O_2$ plasma;
   etching a second InP layer with $HCl:H_3PO_4$;
   rinsing said wafer with $NH_4OH:H_2O$ after etching said second InP portion;
   reactive ion etching a second InGaAsP layer and a third InP layer with said gas mixture, wherein said reactive ion etching forms a second plasma polymer deposited on said wafer;
   removing said second plasma polymer in an $O_2$ plasma; and
   etching a final InP layer with $HCl:H_3PO_4$.

2. The method of claim 1, wherein the ratio of said $H_2SO_4:H_2O_2:H_2O$ for etching said InGaAs cap portion is approximately 10:1:1.

3. The method of claim 1, wherein the ratio of said $HCl:H_3PO_4$ for etching said first, second and final InP layers is approximately 3:1.

4. The method of claim 1, wherein the ratio of said $NH_4OH:H_2O$ for said first and second rinsing of said wafer is approximately 1:20, and wherein said wafer is spin dried after each of said rinsings.

5. The method of claim 1, wherein said gas mixture for said reactive ion etching comprises 4.4 sccm Ar, 11 sccm $CH_4$ and 15 sccm $H_2$ at 20 mT with 250 W.

6. A method of coupling a waveguide to a multi-layered active device structure on a substrate, comprising:
   aligning multiple layers of a multi-layered active device structure via an etch stop adjacent said multi-layered active device structure;
   forming a junction area by etching said active device structure to form a sloped etch profile with respect to said substrate, including:
      etching an InGaAs cap portion with $H_2SO_4:H_2O_2:H_2O$;
      etching a first InP layer with $HCl:H_3PO_4$;
      rinsing said wafer with $NH_4OH:H_2O$;
      reactive ion etching an InGaAsP layer with a gas mixture, wherein said reactive ion etching forms a plasma polymer deposited on said wafer;
      removing said plasma polymer in an $O_2$ plasma;
      etching a second InP layer with $HCl:H_3PO_4$;
      rinsing said wafer with $NH_4OH:H_2O$ after etching said second InP portion;
      reactive ion etching a second InGaAsP layer and a third InP layer with said gas mixture, wherein said reactive ion etching forms a second plasma polymer deposited on said wafer; and
      removing said second plasma polymer in an $O_2$ plasma; and
      etching a final InP layer with $HCl:H_3PO_4$;
   depositing a waveguide over said etched active device structure, wherein a sloped active passive junction is formed at said junction area resulting in a coupled device;
   depositing a SiN layer for use as an etch mask;
   patterning a photoresist mask;
   patterning said SiN layer by reactive ion etching;
   stripping said photoresist mask; and
   etching at least a portion of said coupled device to reduce residual interface reflection in the coupled device.

* * * * *